United States Patent
Takeda

(10) Patent No.: US 7,652,353 B2
(45) Date of Patent: Jan. 26, 2010

(54) SEMICONDUCTOR DEVICE

(75) Inventor: Yasuhiro Takeda, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 191 days.

(21) Appl. No.: 11/681,912

(22) Filed: Mar. 5, 2007

(65) Prior Publication Data

US 2007/0222022 A1  Sep. 27, 2007

(30) Foreign Application Priority Data

Mar. 24, 2006 (JP) ............... 2006-083356
Feb. 5, 2007 (JP) ............... 2007-025211

(51) Int. Cl.
*H01L 29/04* (2006.01)
*H01L 27/10* (2006.01)

(52) U.S. Cl. ............... 257/627; 257/E27.064; 257/E29.004

(58) Field of Classification Search ............ 257/288, 257/499, 347, 401, 355, 357, 375, 657, 629, 257/521, E27.001, E21.421, E21.455, E21.636, 257/407, 343, 627, 206, E27.003, E29.003, 257/E29.004; 438/197, 198
See application file for complete search history.

(56) References Cited

U.S. PATENT DOCUMENTS

| 5,789,791 | A * | 8/1998 | Bergemont ............... 257/401 |
| 5,831,316 | A * | 11/1998 | Yu et al. ............... 257/401 |
| 6,552,372 | B2 * | 4/2003 | Wu et al. ............... 257/173 |
| 7,582,938 | B2 * | 9/2009 | Chen ............... 257/357 |
| 2003/0155592 | A1 * | 8/2003 | Shima et al. ............... 257/288 |
| 2004/0195646 | A1 * | 10/2004 | Yeo et al. ............... 257/527 |
| 2005/0280121 | A1 * | 12/2005 | Doris et al. ............... 257/629 |

FOREIGN PATENT DOCUMENTS

JP  63-80561  4/1988

OTHER PUBLICATIONS

Rittenhouse, A low-voltage pwoer MOSFET with a fast recovery body diode for synchronous rectification. Published by Massachusetts Institute of Technology in 1990. Availabe on Internet; link: ieeexplore.ieee.org/iel2/146/3637/00131177.pdf?arnumber=131177.*

(Continued)

*Primary Examiner*—Lynne A. Gurley
*Assistant Examiner*—Galina Yushina
(74) *Attorney, Agent, or Firm*—Ditthavong, Mori & Steiner, P.C.

(57) ABSTRACT

A semiconductor device for improving performance of a p-channel transistor and an n-channel transistor having multi-finger structures. Gates of the n-channel transistor are arranged so that their gate width direction is parallel to one side of a first region. Gates of the p-channel transistor are arranged so that their gate width direction extends at an angle of 45 degrees with respect to one side of a second region. The ratio of a maximum gate width of the p-channel transistor arranged in the second region to the pitch between the gates of the p-channel transistor is set in accordance with the ratio of the area of an ineffective region to the area of the second region.

15 Claims, 3 Drawing Sheets

OTHER PUBLICATIONS

Chang et al. Extremely Scaled silicon nano-CMOs Devices. Proceedings of the IEEE, vol. 91, No. 11, 2003.*

Rittenhouse et. al. A Low-voltage Power MOSFET with a Fast-recovery Body Diode for Synchronous Rectifier, IEEE, pp. 96-106, 1990.*

H. Sayama, et al., "Effect of <100> Channel Direction for High Performance SCE Immune pMOSFET with Less Than 0.15um Gate Length," IEDM Technology Digest, 1999, p. 657.

H. Momose, et al., "110GHz cutoff frequency of ultra-thin gate oxide p-MOSFETs on (110) surface-oriented Si substrate," 2002 Symposium on VLSI Technology Digest of Technical Papers, IEEE, 2002.

* cited by examiner

SEMICONDUCTOR DEVICE

CROSS-REFERENCE TO RELATED APPLICATIONS

This application is based upon and claims the benefit of priority from the prior Japanese Patent Applications No. 2006-083356, filed on Mar. 24, 2006, and No. 2007-025211, filed on Feb. 5, 2007, the entire contents of which are incorporated herein by reference.

BACKGROUND OF THE INVENTION

The present invention relates to a semiconductor device including a p-channel transistor and an n-channel transistor each of which has a multi-finger structure.

As electronic devices have been downsized and manufactured at lower cost, power transistors that are mounted on such electronic devices are also required to be downsized. In particular, electronic devices that operate at breakdown voltages of 100 V or lower, such as portable devices and household appliances, are required to be further downsized and manufactured at lower costs. A drive circuit mounted on such an electronic device includes a p-channel transistor and an n-channel transistor that are integrated on the same chip.

In the prior art, when a p-channel transistor and an n-channel transistor are integrated on the same chip, the two transistors are arranged in a manner that their carriers move in the same direction due to aspects related with the manufacturing cost and manufacturing equipments. However, the n-channel transistor and the p-channel transistor differ from each other in their crystal plane and crystal axis when mobility of their carriers becomes maximal. In the field of logic large scale integration (LSI), an output circuit is typically formed by connecting a p-channel transistor and an n-channel transistor in a complementary manner. In this case, in the prior art, the output circuit changes channel formation planes (crystal planes) or channel directions (crystal axes) between the n-channel transistor and the p-channel transistor. This technique is described, for example, in Japanese Laid-Open Patent Publication No. 63-80561 and the literature listed below:

H. Sayama et al., "Effect of <100> Channel Direction for High Performance SCE Immune PMOSFET with Less than 0.15 um Gate Length", International Electron Devices Meeting (IEDM) Technology Digest (1999), p. 657.

H. Momose et al., "110 GHz Cutoff Frequency of Ultrathin Gate Oxide P-MOSFETs on (110) Surface-oriented Si Substrate", 2002 Symposium on VLSI Technology Digest of Technical Papers, IEEE (2002).

For example, the literature by H. Momose et al. describes planer transistors, and improves mobility of carriers of both an n-channel transistor and a p-channel transistor by arranging the two transistors in a manner that their channel directions intersect with each other at an angle of 45 degrees.

A lateral double diffused metal oxide semiconductor field effect transistor (hereafter referred to as "LDMOSFET") is a known transistor structure that facilitates integration of a plurality of power transistors. The LDMOSFET is also effective as a structure for integrating the above-described n-channel transistor and p-channel transistor on the same chip. As such, the LDMOSFET has been widely commercialized.

The LDMOSFET normally has a drift region formed close to the drain to increase the breakdown voltage. The drift region typically requires a length of about 0.067 μm/V. For example, to manufacture an LDMOSFET having a breakdown voltage of 40 V, a drift region having a length of about 3 micrometers must be formed using a submicron fabrication technique. The pitch between the source and drain of the LDMOSFET must be at least 5 micrometers to include contacts connected to metal wires and elements such as gate electrodes. Further, a power transistor mounted on a drive circuit must have an extremely wide gate width to minimize on-resistance during switching. Thus, such a power transistor employs a multi-finger structure in which sources and drains are arranged in parallel in the direction of the gate length (channel direction) of the transistor. In the multi-finger structure, the sources and drains are alternately with gates located in between. The multi-finger structure has a plurality of parallel gates arranged in parallel to increase the total gate width of the transistor. However, the multi-finger structure causes the power transistor to occupy a relatively large area on the chip.

Further, a semiconductor device including an n-channel transistor and p-channel transistor having multi-finger structures may have the problem described below when the n-channel transistor and the p-channel transistor are configured to improve carrier mobility in both transistors.

Elements arranged on a main surface of a semiconductor substrate are usually formed in a rectangular region of which sides are parallel to the four sides of a semiconductor chip so that the elements do not increase the chip area in an unnecessary manner. When, for example, a p-channel transistor is arranged in a manner that its gate width direction is at an angle of 45 degrees with respect to the gate width direction of an n-channel transistor, the gate width direction of the p-channel transistor intersects with one side of the rectangular area at an angle of 45 degrees. This arrangement generates an ineffective region that fails to contribute to increasing the gate width of the transistor within the region in which the p-channel transistor is formed. In this case, the specific on-resistance (on-resistance*area) of the transistor cannot be decreased by an amount corresponding to the ineffective region. As a result, even if the n-channel transistor and the p-channel transistor of the semiconductor device are arranged to have different crystal planes and different crystal axes to improve mobility of carriers of the two transistors, the semiconductor device may not always be able to improve performance when the two transistors are formed on the same chip.

SUMMARY OF THE INVENTION

The present invention provides a semiconductor device that efficiently improves the performance of both a p-channel transistor and an n-channel transistor, which have multi-finger structures and which are arranged on the same semiconductor substrate.

One aspect of the present invention is a semiconductor device having a first transistor including a plurality of first gates that are arranged in a multi-finger structure. The plurality of first gates are arranged in parallel at a predetermined pitch in a first region. A second transistor includes a plurality of second gates that are arranged in a multi-finger structure and has a conductivity type differing from that of the first transistor. The plurality of second gates are arranged in parallel at a predetermined pitch and at an angle of 45 degrees with respect to a gate width direction of the first transistor in a second region. One of the plurality of second gates have a maximum gate width. The second region includes an ineffective region free from the second transistor. A ratio of the pitch between the second gates to the maximum gate width of the second transistor is set in accordance with a ratio of the area of the ineffective region to the area of the second region.

A further aspect of the present invention is a semiconductor device having a first transistor including a plurality of first gates that are arranged in a multi-finger structure. The plurality of first gates are arranged in parallel at a predetermined pitch in a first region. A second transistor includes a plurality of second gates that are arranged in a multi-finger structure and have a conductivity type differing from that of the first transistor. The plurality of second gates are arranged in parallel at a predetermined pitch and at an angle of 45 degrees with respect to a gate width direction of the first transistor in a second region. One of the plurality of second gates have a maximum gate width. The second transistor has a predetermined specific on-resistance. A ratio of the pitch between the second gates to the maximum gate width of the second transistor is set so that a value of a first on-resistance obtained when the second gates of the second transistor are each arranged at an angle of 45 degrees with respect to the gate width direction of the first transistor is smaller than a value of a second on-resistance obtained when the second gates of the second transistor are each arranged parallel to the gate width direction of the first transistor.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
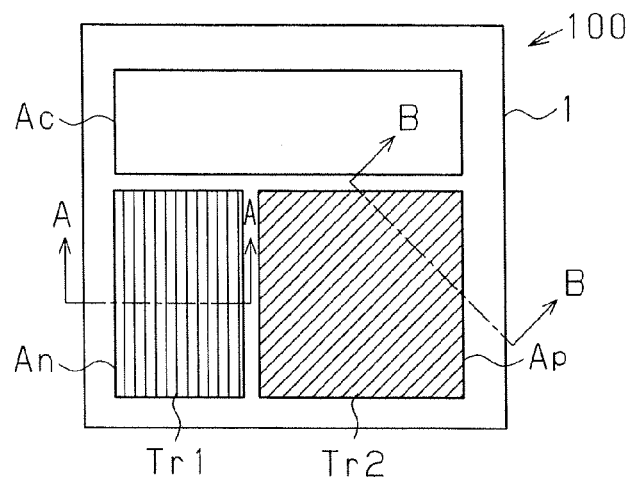
FIG. 1 is a schematic layout diagram showing a semiconductor device according to a first embodiment of the present invention.

In the drawings, like numerals are used for like elements throughout.

A semiconductor device 100 according to a first embodiment of the present invention will now be described with reference to FIGS. 1 to 4.

FIG. 1 is a schematic layout diagram showing the semiconductor device 100 of the first embodiment. The semiconductor device 100 is formed using a silicon substrate (wafer) 1. The silicon substrate 1 has a main surface on which three regions An, Ap, and Ac are formed. The three regions An, Ap, and Ac each preferably have a square or rectangular shape. An n-channel transistor Tr1 is arranged in the region An (first region), a p-channel transistor Tr2 is arranged in the region Ap (second region), and a control circuit is arranged in the region Ac (third region). The control circuit is formed using both an n-channel transistor and a p-channel transistor.

The n-channel transistor Tr1 arranged in the first region An is formed using a plurality of n-channel LDMOSFETs (hereafter referred to as "n-LDMOSFETs"). The p-channel transistor Tr2 arranged in the second region Ap is formed using a plurality of p-channel LDMOSFETs (hereafter referred to as "p-LDMOSFETs"). More specifically, the n-channel transistor Tr1 and the p-channel transistor Tr2 each have a multi-finger structure. The solid lines in FIG. 1 schematically show the gate width direction of each LDMOSFET formed in the first and second regions An and Ap.

In detail, the semiconductor device 100 is formed on the p-type silicon substrate 1 having a (100) plane main surface and a (110) plane orientation flat (hereafter referred to as "OF"). A plurality of n-LDMOSFETs each having a channel extending along a <110> crystal axis are formed in the first region An. A plurality of p-LDMOSFETs each having a channel extending along a <100> crystal axis are formed in the second region Ap. More specifically, the n-LDMOSFETs and the p-LDMOSFETs use different crystal axes, and the channel direction of the p-LDMOSFETs and the channel direction of the n-LDMOSFETs intersect with each other at an angle of 45 degrees. In other words, the gate width direction of the n-LDMOSFETs is parallel to one side of the first region An, and the gate width direction of the p-LDMOSFETs extends at an angle of 45 degrees with respect to one side of the second region Ap. In this specification, the layout in which gates of transistors are arranged at an angle of 45 degrees with respect to one side of a rectangular or square region is referred to as a "45-degree layout".

Figure 2:
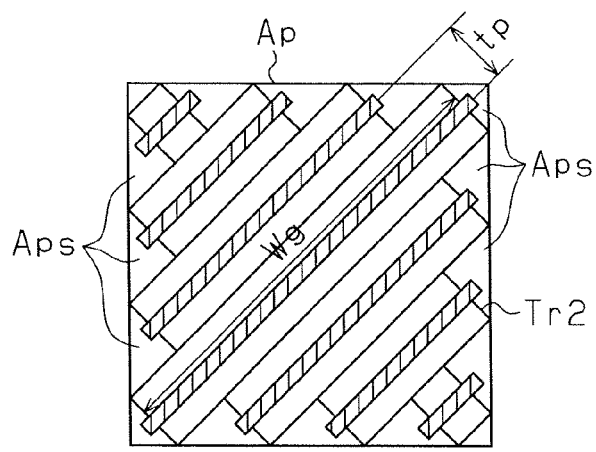
FIG. 2 is a schematic plan view of a p-channel transistor having a multi-finger structure shown in FIG. 1.

FIG. 2 is a schematic plan view showing the p-channel transistor Tr2 arranged in the second region Ap of FIG. 1. As shown in FIG. 2, when the gate width direction of each p-LDMOSFET is at an angle of 45 degrees with respect to one side of the second region Ap, the second region Ap includes triangular ineffective regions Aps in its peripheral portion. The triangular ineffective regions Aps are regions failing to contribute to increasing a gate width of the p-LDMOSFETs. In other words, the second region Ap includes the ineffective regions Aps in which the p-channel transistor Tr2 cannot be formed. The size of the ineffective regions Aps increases as the transistor pitch tp between the gates of the p-LDMOSFETs formed in the second region Ap increases. As the size of the ineffective regions Aps increases, the total gate width of the p-channel transistor Tr2 that can be arranged in the same area (second region Ap) decreases. Thus, in the multi-finger structure, the layout of the transistor at an angle of 45 degrees may not always decrease the specific on-resistance (on-resistance*area) of the transistor depending on the size of the ineffective regions Aps. When the 45-degree layout is used, the channel direction of each p-LDMOSFET in the second region Ap extends in the <100> direction. This increases the mobility of holes of the p-LDMOSFETs and decreases the on-resistance per unit gate width. However, when these p-LDMOSFETs are arranged in the second region Ap, the ineffective regions Aps that depend on the transistor pitch tp are generated in the second region Ap. This decreases the total gate width of the p-channel transistor Tr2 that can be arranged in the region as compared with when the transistor is arranged in a normal layout. As a result, the resistance relative to the layout area, that is, the specific on-resistance, does not always decrease.

Figure 3:
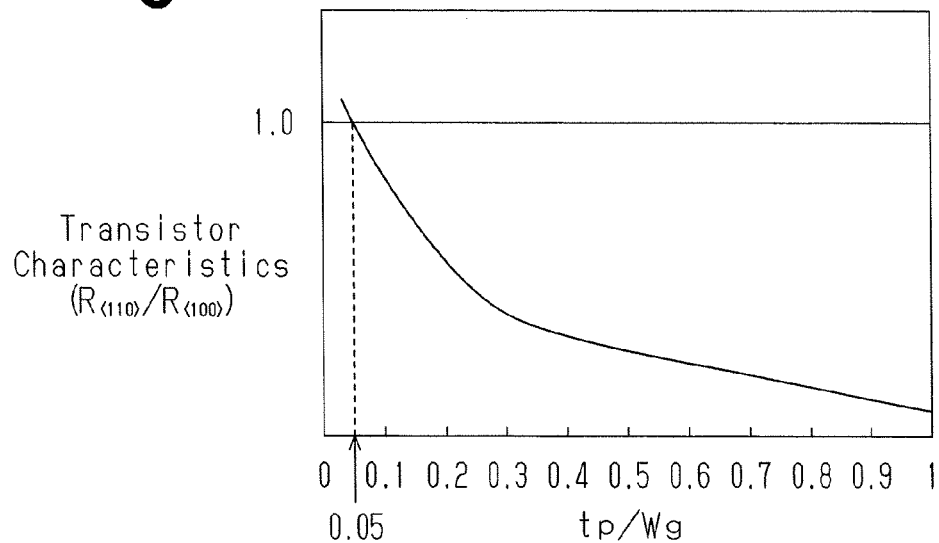
FIG. 3 is a graph showing the transistor characteristics of the p-channel transistor shown in FIG. 2.

FIG. 3 is a schematic graph showing the characteristics of the p-channel transistor Tr2 of FIG. 2. In FIG. 3, the horizontal axis shows the ratio tp/Wg of the maximum gate width Wg that is the gate width of one of the p-LDMOSFETs arranged in the second region Ap and the transistor pitch tp of the p-LDMOSFETs. The vertical axis shows the ratio $R_{<110>}/R_{<100>}$ of the specific on-resistance (first on-resistance) $R_{<100>}$ of the p-channel transistor Tr2 of which channel direction extends along the <100> crystal axis relative to the specific on-resistance (second on-resistance) $R_{<110>}$ of the p-channel transistor Tr2 of which channel direction extends along the <110> crystal axis. The first on-resistance $R_{<100>}$ corresponds to the specific on-resistance value obtained when each gate of the p-channel transistor Tr2 is arranged at an angle of 45 degrees with respect to the gate width direction of the n-channel transistor Tr1. The second on-resistance $R_{<110>}$ corresponds to a specific on-resistance value obtained when each gate of the p-channel transistor Tr2 is arranged parallel to the gate width direction of the n-channel transistor Tr1.

As shown in FIG. 3, the ratio $R_{<110>}/R_{<100>}$ increases as the ratio tp/Wg decreases. When the ratio tp/Wg is 0.0526 (about 5%), the ratio $R_{<110>}/R_{<100>}$ is 1.0. The ratio $R_{<110>}/R_{<100>}$ of 1.0 indicates a state in which the first on-resistance $R_{<100>}$ and the second on-resistance $R_{<110>}$ are in balance. More specifically, the ratio $R_{<110>}/R_{<100>}$ of 1.0 means that the first on-resistance $R_{<100>}$ and the second resistance $R_{<110>}$ have substantially the same value even when the p-channel transistor Tr2 is arranged at an angle of 45 degrees in the second region Ap. Accordingly, when the ratio tp/Wg is set so that the ratio $R_{<110>}/R_{<100>}$ becomes greater than 1.0, the specific on-resistance of the p-channel transistor Tr2 is decreased. The value of the ratio tp/Wg that causes the ratio to satisfy $R_{<110>}/R_{<100>}>1.0$ is determined based on expression 1.

$$Wg>tp*(\alpha+\beta-1)/(1-\alpha) \quad \text{Expression 1}$$

In expression 1, α represents a resistance reduction rate (first coefficient) indicating the ratio of the first on-resistance $R_{<100>}$ and the second on-resistance $R_{<110>}$ and is expressed by $$\alpha=R_{<100>}/R_{<110>}.$$

In expression 1, β is a layout factor (second coefficient) indicating the ratio at which the ineffective regions Aps occupy the second region Ap. In the first embodiment, the layout factor β is determined such that the area of the second region Ap having a square shape is expressed by β=1. Substituting β=1 in expression 1 transforms expression 1 into expression 2.

$$tp/Wg<(1-\alpha)/\alpha \quad \text{Expression 2}$$

When, for example, the decreasing effect of the on-resistance resulting from the 45-degree layout, that is, the improvement effect of carrier mobility in the p-channel transistor Tr2, is 5%, α=0.95 is substituted into expression 2 to obtain expression 3.

$$tp/Wg<5.26 \ (\%) \quad \text{Expression 3}$$

Thus, when the second region Ap has a square shape, by setting the transistor pitch tp and the maximum gate width Wg in a manner that the ratio tp/Wg becomes smaller than 5.26 (%), the specific on-resistance of the p-channel transistor Tr2 can be decreased.

The transistor pitch tp is typically a fixed value determined by the breakdown voltages of the first and second transistors included in the semiconductor device 100. In the first embodiment, the ratio of the transistor pitch tp and the maximum gate width Wg is preferably set by fixing the transistor pitch tp and changing the maximum gate width Wg. Thus, when, for example, the transistor pitch tp is set at 5 micrometers based on the transistor breakdown voltages, expression 3 is calculated with the maximum gate width Wg satisfying Wg>95 (μm).

Thus, when tp=5 (μm) is satisfied, the maximum gate width Wg of the p-channel transistor Tr2 is set to be greater than 95 micrometers to decrease the specific on-resistance of the p-channel transistor Tr2.

Figure 4:
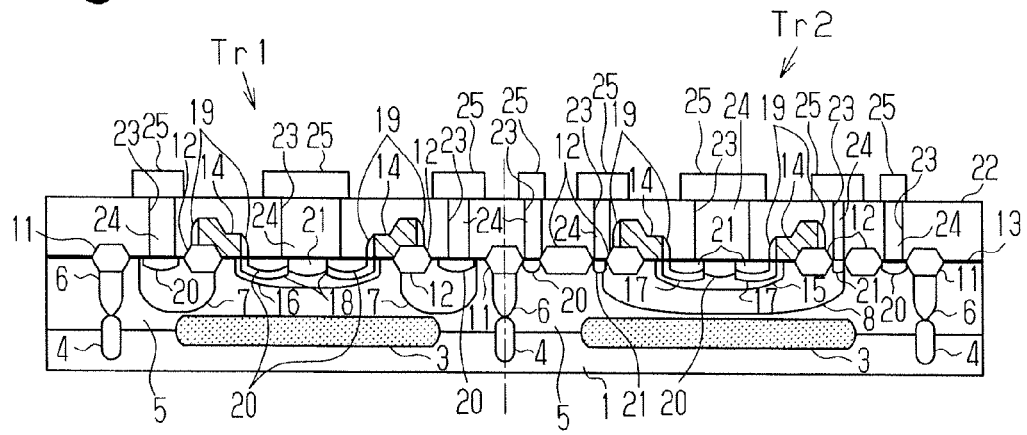
FIG. 4 is a schematic cross-sectional view showing the semiconductor device of FIG. 1.

FIG. 4 is a schematic cross-sectional view showing the structure of the semiconductor device 100 in the first embodiment. FIG. 4 only shows one pair of the plurality of fingers (LDMOSFETs) forming the multi-finger structure of each of the n-channel transistor Tr1 and the p-channel transistor Tr2. For the sake of brevity, FIG. 4 is divided into two parts by a broken line with the left side of the broken line showing the cross-sectional structure of the semiconductor device 100 taken along line A-A of FIG. 1 (n-LDMOSFEs) and the right side of the broken line showing the cross-sectional structure of the semiconductor device 100 taken along line B-B of FIG. 1 (p-LDMOSFETs).

The semiconductor device 100 of the first embodiment is formed using the p-type silicon substrate 1 having a (100) plane main surface and a (110) plane OF. An n-type epitaxial silicon layer 5 having, for example, a resistivity of about 1 to 2 Ω·cm and a thickness of about 2 micrometers is formed on the silicon substrate 1. An n+ embedded diffusion layer 3 having, for example, a sheet resistance of about 20Ω/□ is embedded between the n-type epitaxial silicon layer 5 and the silicon substrate 1.

The first region An and the second region Ap are separated by a diffusion layer 4 formed within the silicon substrate 1 and a diffusion layer 6 that extends from the diffusion layer 4 toward the upper surface of the n-type epitaxial silicon layer 5. Further, an insulation film 11 connected to the diffusion layer 6 and a field insulation film 12 that electrically isolates each LDMOSFET or electrically isolates each layer in each LDMOSFET are formed in a surface portion of the n-type epitaxial silicon layer 5 by performing local oxidation of silicon (LOCOS).

In the first region An, a drift diffusion layer 7, serving as a drift layer of each n-LDMOSFET, is formed in a surface portion of the n-type epitaxial silicon layer 5. The drift diffusion layer 7 is formed using phosphorous (P). The drift diffusion layer 7 is preferably formed when an n-well of the control circuit is formed in the third region Ac. Further, a body diffusion layer 16 for each n-LDMOSFET is formed in a surface portion of the n-type epitaxial silicon layer 5. The body diffusion layer 16 is formed using boron (B). A source diffusion layer 18 for each n-LDMOSFET is formed in the body diffusion layer 16. The source diffusion layer 18 is formed using arsenic (As). Further, an n+ highly concentrative diffusion layer 20 is formed on the source diffusion layer 18 and the drift diffusion layer 7 of each n-LDMOSFET. The n+ highly concentrative diffusion layer 20 is formed using arsenic (As). A p+ highly concentrative diffusion layer 21 is formed in a back gate contact region of each n-LDMOSFET. The p+ highly concentrative diffusion layer 21 is formed using boron (B).

In the second region Ap, a drift diffusion layer 8, serving as a drift layer of each p-LDMOSFET, is formed in a surface portion of the n-type epitaxial silicon layer 5. The drift diffusion layer 8 is formed using boron (B). The drift diffusion layer 8 is preferably formed when a p-well of the control circuit is formed in the third region Ac. Further, a body diffusion layer 15 is formed in a surface portion of the drift diffusion layer 8, which is formed in the n-type epitaxial silicon layer 5. The body diffusion layer 15 is formed using phosphorous (P). A source diffusion layer 17 is formed on the body diffusion layer 15 using boron (B). Further, an n+ highly concentrative diffusion layer 20 is formed on the body diffusion layer 15 (well) of each p-LDMOSFET and in a back gate contact region of each p-LDMOSFET. The n+ highly concentrative diffusion layer 20 is formed using arsenic (As). Further, a p+ highly concentrative diffusion layer 21 is formed on the drift diffusion layer 8 and the source diffusion layer 17 of each p-LDMOSFET. The p+ highly concentrative diffusion layer 21 is formed using boron (B).

Gate electrodes 14 of the n-LDMOSFETs and the p-LDMOSFETs are formed on the upper surface of the n-type epitaxial silicon layer 5 with a gate insulation film 13 located in between. The gate electrodes 14 may be formed, for example, by depositing polysilicon on the gate insulation film 13 through, for example, low pressure chemical vapor deposition (LD-CVD) and then performing a heat treatment using, for example, POCl3 (phosphorous oxychloride) to dope the polysilicon with phosphorous P. Side walls 19 are formed on opposite sides of each gate electrode 14. The side walls 19 may be formed, for example, by depositing an inter-layer insulation film having a thickness of about 2000 angstroms from above the n-type epitaxial silicon layer 5 by performing, LP-CVD using tetraethoxysilane (TEOS) and then etching back the film by performing with reactive ion etching (RIE).

Further, an inter-layer insulation film 22 is formed on the upper surface of the n-type epitaxial silicon layer 5 by performing, for example, high-density plasma chemical vapor deposition (HDP-CVD). Contact holes 23 are formed in the inter-layer insulation film 22 through photolithography and RIE in a manner that the contact holes 23 reach the n+ highly concentrative diffusion layer 20 and the p+ highly concentrative diffusion layer 21

A contact plug 24 is formed in each contact hole 23. The contact plug 24 is formed, for example, by depositing tungsten (W) within the contact hole 23 by performing, for example, CVD using tungsten hexafluoride (WF6) gas and then etching back the tungsten. A metal wire 25 is electrically connected to each contact plug 24. The metal wire 25 is formed, for example, by depositing a laminate of TiN/Al—Cu/TiN through sputtering, and then subjecting the laminate to photolithography and etching.

The semiconductor device 100 of the first embodiment has the advantages described below.

(1) Each n-LDMOSFET of the n-channel transistor Tr1 has a channel extending along the <110> crystal axis, and each p-LDMOSFET of the p-channel transistor Tr2 has a channel extending along the <100> crystal axis. Thus, the carrier mobility of each LDMOSFET on the (100) plane of the wafer, that is, the current driving capability, is optimized. This improves the performance of both of the n-channel and p-channel transistors Tr1 and Tr2.

(2) The semiconductor device 100 is formed using the silicon substrate 1 having the (100) plane main surface and the (110) plane OF. In this case, the dicing direction of the chip and the cleavage direction of the silicon substrate 1 coincide with each other. This increases the manufacturing yield of the semiconductor device as compared with when a semiconductor device is manufactured using a silicon substrate having a (100) plane main surface and a (100) plane OF.

A semiconductor device 200 according to a second embodiment of the present invention will now be described with reference to FIGS. 5 to 6.

Figure 5:
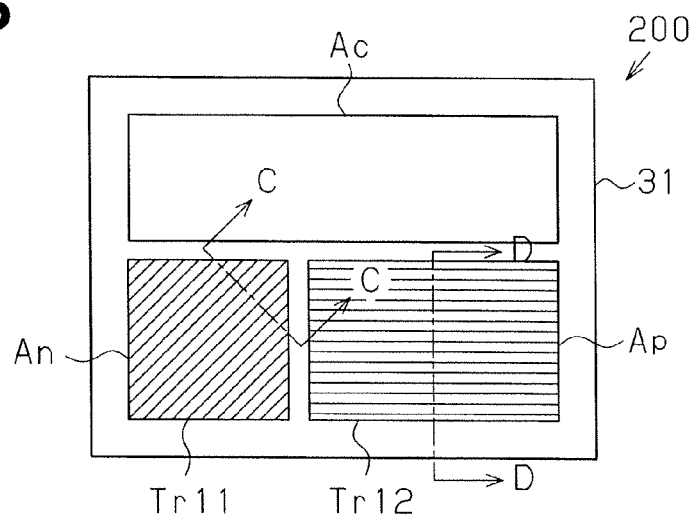
FIG. 5 is a schematic layout diagram showing a semiconductor device according to a second embodiment of the present invention.

FIG. 5 is a schematic layout diagram showing the semiconductor device 200 of the second embodiment. In the same manner as the semiconductor device 100 of the first embodiment, the semiconductor device 200 of the second embodiment includes three regions An, Ap, and Ac, each preferably having a square shape or a rectangular shape and formed on a main surface of a silicon substrate (wafer) 31. An n-channel transistor Tr11 is arranged in the first region An, a p-channel transistor Tr12 is arranged in the second region Ap, and a control circuit is arranged in the third region Ac. The control circuit is formed using both an n-channel transistor and a p-channel transistor.

The semiconductor device 200 of the second embodiment differs from the semiconductor device 100 of the first embodiment in that each of the n-channel transistor Tr11 and the p-channel transistor Tr12 is formed using trench gate DMOSFETs. More specifically, the n-channel transistor Tr11 arranged in the first region An has a multi-finger structure using a plurality of trench gate n-DMOSFETs, and the p-channel transistor Tr12 arranged in the second region Ap has a multi-finger structure using a plurality of trench gate p-DMOSFETs. The solid lines in FIG. 5 schematically show the gate width direction of each trench gate DMOSFET formed in the first and second regions An and Ap.

In the same manner as in the first embodiment, the semiconductor device 200 of the second embodiment is formed on the p-type silicon substrate 31 having a (100) plane main surface and a (110) plane OF. In detail, a channel formation plane of the trench gate n-DMOSFETs is formed using a (100) plane in the first region An, and a channel formation plane of the trench gate p-DMOSFETs is formed using a (110) plane in the second region Ap. More specifically, the trench gate n-DMOSFETs and the trench gate p-DMOSFETs use different crystal planes, and the channel formation plane of the trench gate p-DMOSFETs and the channel formation plane of the trench gate n-DMOSFETs intersect with each other at an angle of 45 degrees. In other words, in the second embodiment, the gate width direction of the trench gate p-DMOSFETs is parallel to one side of the second region Ap, and the gate width direction of the trench gate n-DMOSFETs extends at an angle of 45 degrees with respect to one side of the first region An.

In the semiconductor device 200 of the second embodiment with the above-described structure, the n-channel transistor Tr11 arranged at an angle of 45 degrees in the first region An has the same transistor characteristics as the p-channel transistor Tr2 described in the first embodiment (refer to FIG. 3). In the second embodiment, the ratio $R_{(110)}/R_{(100)}$ of the n-channel transistor Tr11 increases as the ratio tp/Wg decreases. Thus, the ratio tp/Wg of the n-channel transistor Tr11 is set in accordance with expression 1 in the same manner as in the first embodiment. For example, when the first region An is a square region and the 45-degree layout enables the on-resistance to decrease by 10%, the values of tp and Wg of the n-channel transistor Tr11 are set to satisfy tp/Wg<11.11(%) using expression 1 in the same manner as in the first embodiment.

Figure 6:
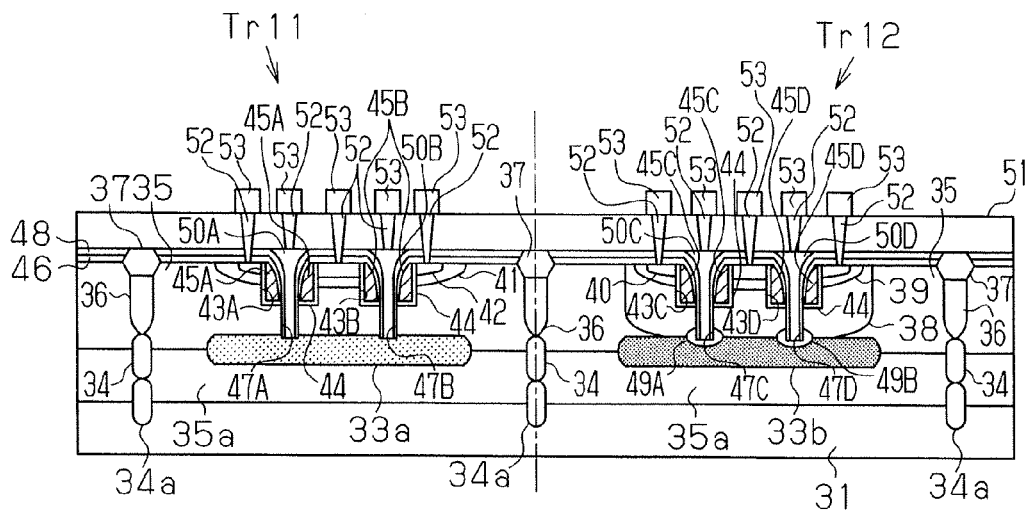
FIG. 6 is a schematic cross-sectional view showing the semiconductor device of FIG. 5.

FIG. 6 is a schematic cross-sectional view showing the structure of the semiconductor device 200 according to the second embodiment. FIG. 6 only shows one pair of a plurality of fingers (trench gate DMOSFETs) forming the multi-finger structure of each of the n-channel transistor Tr11 and the p-channel transistor Tr12. For the sake of brevity, FIG. 6 is divided into two parts by a broken line, with the left side of the broken line showing the cross-sectional structure of the semiconductor device 200 taken along line C-C of FIG. 5 (trench gate n-DMOSFEs) and the right side of the broken line showing the cross-sectional structure of the semiconductor device 200 taken along line D-D of FIG. 5 (trench gate p-DMOS-FETs).

The semiconductor device 200 is formed using a p-type silicon substrate (wafer) 31 having a (100) plane main surface and a (110) plane OF. N-type epitaxial silicon layers 35a and 35 are formed on the silicon substrate 31. Between the n-type epitaxial silicon layers 35a and 35, an n+ embedded diffusion layer 33a is embedded in the first region An and a p+ embedded diffusion layer 33a is embedded in the second region Ap. The first region An and the second region Ap are separated by diffusion layers 34a, 34, and 36 and an insulation layer 37 connected to the diffusion layer 36.

In the first region An, a body diffusion layer 41 is formed in a surface portion of the n-type epitaxial silicon layer 35. The body diffusion layer 41 is formed using boron (B). A source diffusion layer 42 is formed using arsenic (As) within the body diffusion layer 41. Further, trench grooves 43A and 43B having a width of about 1.5 micrometers and a depth of about 1 micrometer are formed in the n-type epitaxial silicon layer 35 in a manner that the trench grooves 43A and 43B extend through the body diffusion layer 41 and the source diffusion layer 42.

A gate electrode 45A, which is in the form of a side wall, is formed on the inner wall of the trench groove 43A with a gate insulation film 44 arranged in between. Further, a gate electrode 45B, which is in the form of a side wall, is formed on the inner wall of the trench groove 43B with a gate insulation film 44 arranged in between. The gate electrodes 45A and 45B are formed by depositing polysilicon with a thickness of about 2000 angstroms in the trench grooves 43A and 43B. Then, a heat treatment using, for example, POCl3 (phosphorous oxychloride) is performed to dope the polysilicon with phosphorous P, and then RIE is carried out to perform anisotropic etching.

Further, a groove 47A is formed in the trench 43A and a groove 47B is formed in the trench groove 43B by way of an inter-layer insulation film 46 having a thickness of about 1000 angstroms. The grooves 47A and 47B extend from an upper surface of the n-type epitaxial silicon layer 35 to the n+ embedded diffusion layer 33a. An inter-layer insulation film 48 having a thickness of about 1000 angstroms is formed on the inner walls of the grooves 47A and 47B and on the inter-layer insulation film 46 in a manner that only the bottom surfaces of the grooves 47A and 47B are exposed to the outer side.

In the second region Ap, a drift diffusion layer 38 that comes in contact with the p+ embedded diffusion layer 33b is formed in a surface portion of the n-type epitaxial silicon layer 35. The drift diffusion layer 38 is formed using boron (B). A body diffusion layer 39 is formed using phosphorous (P) within the drift diffusion layer 38. A source diffusion layer 40 is formed using boron (B) within the body diffusion layer 39. Further, trench grooves 43C and 43D having a width of about 1.5 micrometers and a depth of about 1 micrometer are formed in the n-type epitaxial silicon layer 35 in a manner that the trench grooves 43C and 43D are formed through the body diffusion layer 39 and the source diffusion layer 40. A gate electrode 45C having the form of a side wall is formed on the inner wall of the trench groove 43C with a gate insulation film 44 arranged in between, and a gate electrode 45D having the form of a side wall is formed on the inner wall of the trench groove 43D with a gate insulation film 44 arranged in between.

Further, a groove 47C is formed in the trench groove 43C and a groove 47D is formed in the trench groove 43D by way of an inter-layer insulation film 46 having a thickness of about 1000 angstroms. The grooves 47C and 47D are formed to extend from the upper surface of the n-type epitaxial silicon layer 35 and reach the p+ embedded diffusion layer 33b. An inter-layer insulation film 48 having a thickness of about 1000 angstroms is formed on the inner walls of the grooves 47C and 47D and on the inter-layer insulation film 46 in a manner that only the bottom surfaces of the grooves 47C and 47D are exposed to the outer side. Further, a drain diffusion layer 49A is formed on a lower end portion of the groove 47C, and a drain diffusion layer 49B is formed on a lower end portion of the groove 47D. The drain diffusion layers 49A and 49B are formed using boron (B).

A drain lead electrode 50A is formed in the groove 47A, and a drain lead electrode 50B is formed in the groove 47B. The drain lead electrodes 50A and 50B are connected to the n+ embedded diffusion layer 33a. A drain lead electrode 50C is formed in the groove 47C, and a drain lead electrode 50D is formed in the groove 47D. The drain lead electrode 50C is connected to the drain diffusion layer 49A, and the drain lead electrode 50D is connected to the drain diffusion layer 49B. The drain lead electrodes 50A to 50D are formed by forming a barrier metal of, for example, titanium nitride (TiN), depositing tungsten in the grooves 47A to 47D by performing CVD using tungsten hexafluoride (WF6) gas, and performing RIE to etch back the tungsten.

An inter-layer insulation film 51 is formed on an upper surface of the inter-layer insulation film 48 by performing, for example, HDP-CVD. Contact plugs 52 are formed in the inter-layer insulation film 51 in a manner that the contact plugs 52 reach the source diffusion layers 40 and 42 and the drain lead electrodes 50A to 50D. The contact plugs 52 are formed using tungsten. A metal wire 53 is formed by a laminate of TiN/Al—Cu/TiN on an upper surface of each contact plug 52.

The semiconductor device 200 of the second embodiment has the advantages described below.

(1) Each trench gate n-DMOSFET of the n-channel transistor Tr11 has the (100) plane channel formation plane, and each trench gate p-DMOSFET of the p-channel transistor Tr12 has the (110) plane channel formation plane. Thus, carrier mobility of each trench gate DMOSFET, that is, the current driving capability, is optimized. This improves the performance of both the n-channel and p-channel transistors Tr11 and Tr12. In particular, the p-channel transistor and the n-channel transistor have the channel formation planes (that is, the crystal planes) that intersect with each other at an angle of 45 degrees in the second embodiment. As a result, the carrier mobility of the two transistors is further improved as compared with when the channel directions (that is, the crystal axes) of the two transistors intersect with each other at an angle of 45 degrees. This further improves the performance of both the n-channel and p-channel transistors.

(2) The semiconductor device 200 is formed using the silicon substrate 31 having the (100) plane main surface and the (110) plane OF. In this case, the dicing direction of the chip and the cleavage direction of the silicon substrate 31 coincide with each other. This increases the manufacturing yield of the semiconductor device as compared with when a semiconductor device is manufactured using a silicon substrate having a (100) plane main surface and a (100) plane OF.

NUMERICAL EXAMPLES

Numerical examples of the transistor characteristics of the semiconductor device of the present invention will now be described.

Figure 7:
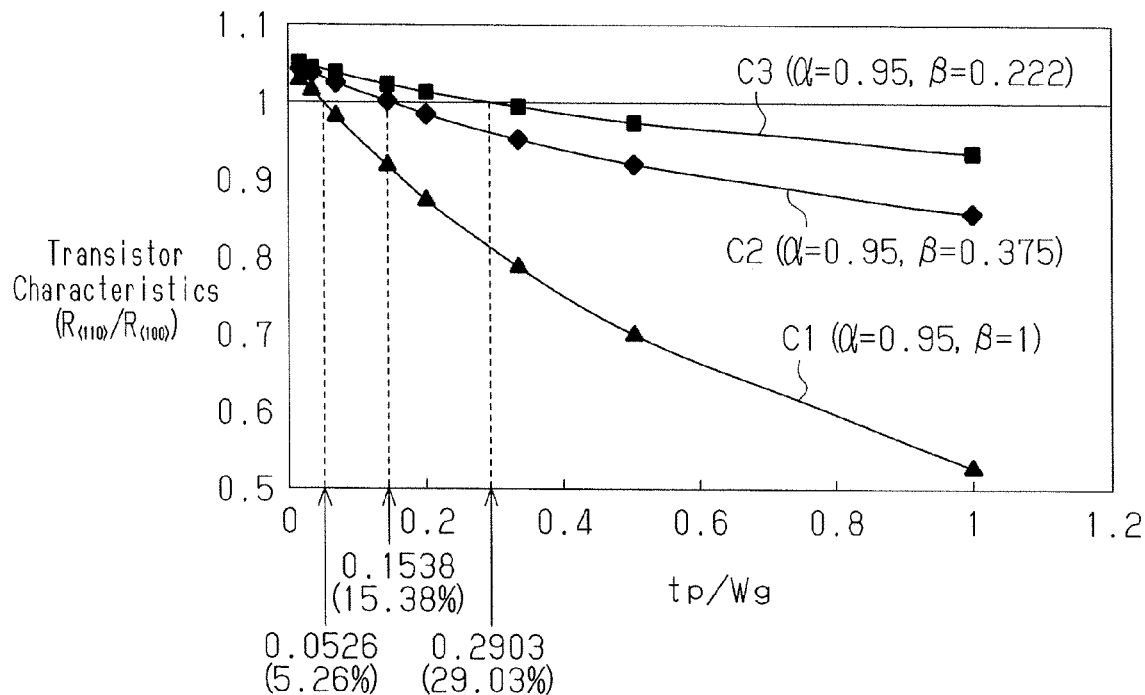
FIG. 7 is a graph showing the transistor characteristics of a transistor arranged in a 45-degree layout when its resistance reduction rate $\alpha$ is 0.95.

FIG. 7 is a graph showing the relationship between the ratio tp/Wg and the ratio $R_{normal\ layout}/R_{45\text{-}degree\ layout}$ when the 45-degree layout is used and the resistance reduction rate α is 0.95 (that is, the on-resistance reduction rate is 5%). A layout in which gates of transistors are arranged parallel to one side of a rectangular or square region is referred to as a "normal layout". Further, $R_{normal\ layout}$ refers to the specific on-resistance of a transistor arranged in the normal layout. $R_{45\text{-}degree\ layout}$ refers to the specific on-resistance of a transistor arranged in the 45-degree layout described above (in which the transistor gate is arranged at an angle of 45 degrees with respect to one side of the region).

A curve C1 shown in FIG. 7 indicates the characteristics of a transistor arranged at an angle of 45 degrees in a square region. The curve C1 corresponds to the curve shown in FIG. 3, or the characteristics of the transistor when its layout factor β is 1. As described with reference to FIG. 3, when α=0.95 and β=1, by setting the ratio tp/Wg to be smaller than 5.26%, the 45-degree layout decreases the specific on-resistance of the transistor.

A curve C2 shown in FIG. 7 indicates the characteristics of a transistor arranged in a rectangular region having the ratio of its short side and long side being 1 to 2. In this case, the layout factor β indicating the occupying ratio of ineffective regions generated by the 45-degree layout in a rectangular region with a ratio of its short side and long side being 1 to N is expressed by expression 4.

$$\beta=(L1-L2)/(L1*N) \qquad \text{Expression 4}$$

In expression 4, L1 is the total number of unit sides of a rectangular region when one side of a square region, which serves as a unit shape, is "1". In this case, the total number of unit sides includes the number of sides that are shared by a plurality of square regions (unit shapes) included in the rectangular region with the short-side and long-side ratio of 1 to N. For example, a rectangular region with a short-side and long-side ratio of 1 to 2 includes two square regions. For this rectangular region, the total number of unit sides L1 is 8. Further, in expression 4, L2 is the number of overlapping sides. For example, for the rectangular region with the short-side and long-side ratio of 1 to 2, the number of shared sides L2 is 2.

Using expression 4, the layout factor β is 0.375 for the rectangular area with the short-side and long-side ratio of 1 to 2. Thus, when the conditions of α=0.95 and β=0.375 are satisfied, by setting the ratio tp/Wg to be smaller than 15.38%, this enables the 45-degree layout to decrease the specific on-resistance of the transistor.

A curve C3 shown in FIG. 7 indicates the characteristics of a transistor arranged in a rectangular region with a short-side and long-side ratio of 1 to 3. In this case, the layout factor β is 0.222 as calculated from expression 4. Thus, when the conditions of α=0.95 and β=0.222 are satisfied, by setting the ratio tp/Wg to be smaller than 29.03%, this enables the 45-degree layout to decrease the specific on-resistance of the transistor.

As indicated by the curves C1, C2, and C3, when the value of tp is fixed (e.g. at 5 micrometers), the maximum gate width Wg in the rectangular region with the short-side and long-side ratio of 1 to 2 is smaller than the maximum gate width Wg in a square region. Further, the maximum gate width Wg in the rectangular region with the short-side and long-side ratio of 1 to 3 is smaller than the maximum gate width Wg in the rectangular region with the short-side and long-side ratio of 1 to 2. This is because in the rectangular region with the short-side and long-side ratio of 1 to N, overlapping sides reduce the area occupied by ineffective regions as compared with a square region. Accordingly, the maximum gate width Wg decreases as the overlapping sides increase in a rectangular region.

Figure 8:
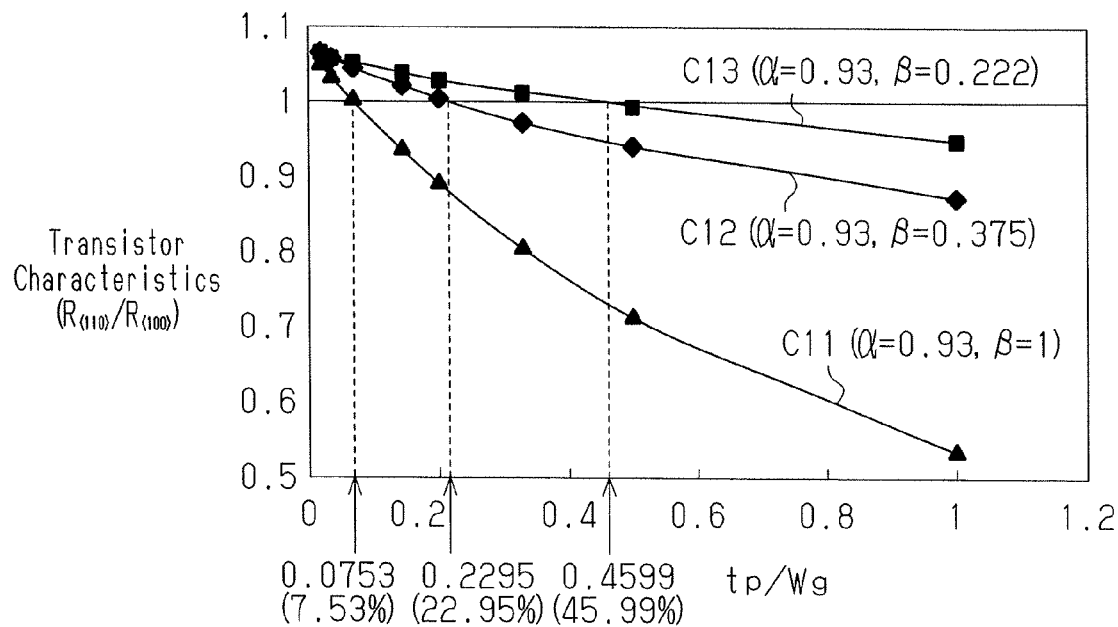
FIG. 8 is a graph showing the transistor characteristics of a transistor arranged in a 45-degree layout when its resistance reduction rate $\alpha$ is 0.93.

FIG. 8 is a graph showing the relationship between the ratio tp/Wg and the ratio $R_{(normal\ layout)}/R_{(45\text{-}degree\ layout)}$ when the 45-degree layout is used and the resistance reduction rate α is 0.93 (that is, the on-resistance reduction rate is 7%).

A curve C11 indicates the characteristics of a transistor arranged in a square region (that is, β=1). When the conditions of α=0.93 and β=1 are satisfied, the ratio tp/Wg is set to be smaller than 7.53% so that the 45-degree layout decreases the specific on-resistance of the transistor.

A curve C12 indicates the characteristics of a transistor arranged in a rectangular region with a short-side and long-side ratio of 1 to 2 (that is, β=0.375). When the conditions of α=0.93 and β=0.375 are satisfied, the ratio tp/Wg is set to be smaller than 22.95% so that the 45-degree layout decreases the specific on-resistance of the transistor.

A curve C13 indicates the characteristics of a transistor arranged in a rectangular region with a short-side and long-side ratio of 1 to 3 (that is, β=0.222). When the conditions of α=0.93 and β=0.222 are satisfied, the ratio tp/Wg is set to be smaller than 45.99% so that the 45-degree layout decreases the specific on-resistance of the transistor.

It should be apparent to those skilled in the art that the present invention may be embodied in many other specific forms without departing from the spirit or scope of the invention. Particularly, it should be understood that the present invention may be embodied in the following forms.

The transistor having the multi-finger structure is not limited to a transistor using LDMOSFETs or trench gate DMOSFETs and may be a typical MOS transistor having other structures.

The region in which the transistor is arranged at an angle of 45 degrees is not limited to a region having a square or rectangular shape.

In the above embodiments, a wafer with another plane orientation may be used instead of the silicon wafer having the (100) plane main surface and the (110) plane OF. A wafer with another plane orientation may be used as long as the specific on-resistance of each of the n-channel transistor and the p-channel transistor is improved by the 45-degree layout in which the channel directions or channel formation planes of the two transistors intersect with each other at an angle of 45 degrees.

The present examples and embodiments are to be considered as illustrative and not restrictive, and the invention is not to be limited to the details given herein, but may be modified within the scope and equivalence of the appended claims.

What is claimed is:

1. A semiconductor device comprising:
   a first transistor including a plurality of first gates that are arranged in a multi-finger structure, wherein the plurality of first gates are arranged in parallel at a predetermined pitch in a first region; and
   a second transistor including a plurality of second gates that are arranged in a multi-finger structure and having a conductivity type differing from that of the first transistor, wherein the plurality of second gates are arranged in parallel at a predetermined pitch and at an angle of 45 degrees in a second region with respect to a gate width direction of the first transistor, with one of the plurality of second gates having a maximum gate width;
   wherein the second region includes an ineffective region free from the second transistor, and a ratio of the pitch between the second gates to the maximum gate width of the second transistor is set less than a reference ratio that is determined in accordance with a ratio of the area of the ineffective region to the area of the second region; and wherein the first region and the second region each have a square shape or a rectangular shape, each first gate of the first transistor is arranged in parallel to one side of the first region, each second gate of the second transistor is arranged at an angle of 45 degrees with respect to one side of the second region, and the second gates of the second transistor are formed in two or more different gate widths.

2. The semiconductor device according to claim 1, wherein the first and second transistors each have a channel, with the semiconductor device being manufactured using a silicon wafer including a crystal axis defining a channel direction for each of the first and second transistors and a crystal plane defining a channel formation plane for each of the first and second transistors, with the first and second transistors having different channel directions or different channel formation planes that are based on mobility of a carrier dependent on the conductivity type.

3. The semiconductor device according to claim 1, wherein the pitch between the second gates is a fixed value, and the ratio of the pitch between the second gates to the maximum gate width of the second transistor is set by fixing the pitch between the second gates and changing the maximum gate width.

4. The semiconductor device according to claim 1, wherein the pitch between the second gates is a fixed value determined based on a breakdown voltage of each of the first and second transistors.

5. The semiconductor device according to claim 1, wherein the first and second transistors are each formed using an LDMOSFET.

6. The semiconductor device according to claim 1, wherein the first and second transistors each have a trench gate structure.

7. The semiconductor device according to claim 1, wherein the first transistor is a p-channel transistor, and the second transistor is an n-channel transistor.

8. The semiconductor device according to claim 1, further comprising:

a control circuit including a p-channel transistor and an n-channel transistor, each having a gate and a gate width direction, with the p-channel transistor and the n-channel transistor being arranged so that their gate width directions are parallel.

9. The semiconductor device according to claim 1, wherein the second region for arranging the second transistor is a rectangular region with a ratio of its short side and long side being 1 to N, where N is a positive value.

10. The semiconductor device according to claim 1, wherein the second transistor has a predetermined specific on-resistance dependent that is in accordance with the ratio of the area of the ineffective region to the area of the second region, and the ratio of the pitch between the second gates to the maximum gate width of the second transistor is set in a manner that a value of a first on-resistance obtained when each second gate of the second transistor is arranged at an angle of 45 degrees with respect to the gate width direction of the first transistor is smaller than a value of a second on-resistance obtained when each second gate of the second transistor is arranged parallel to the gate width direction of the first transistor.

11. The semiconductor device according to claim 10, wherein the ratio of the pitch between the second gates to the maximum gate width of the second transistor is calculated using a first coefficient indicating a ratio of the first on-resistance to the second on-resistance and a second coefficient indicating the ratio of the area of the ineffective region to the area of the second region.

12. A semiconductor device comprising:

a first transistor including a plurality of first gates that are arranged in a multi-finger structure, wherein the plurality of first gates are arranged in parallel at a predetermined pitch in a first region; and a second transistor including a plurality of second gates that are arranged in a multi-finger structure and having a conductivity type differing from that of the first transistor, wherein the plurality of second gates are arranged in parallel at a predetermined pitch and at an angle of 45 degrees in a second region with respect to a gate width direction of the first transistor, with one of the plurality of second gates having a maximum gate width;

wherein a ratio of the pitch between the second gates to the maximum gate width of the second transistor is set so that a value of a first specific on-resistance of the second region obtained when the second gates of the second transistor are each arranged at an angle of 45 degrees with respect to the gate width direction of the first transistor is smaller than a value of a second specific on-resistance of the second region obtained when the second gates of the second transistor are each arranged parallel to the gate width direction of the first transistor; and wherein the first region and the second region each have a square shape or a rectangular shape, each first gate of the first transistor is arranged in parallel to one side of the first region, each second gate of the second transistor is arranged at an angle of 45 degrees with respect to one side of the second region, and the second gates of the second transistor are formed in two or more different gate widths.

13. The semiconductor device according to claim 12, wherein the second region for arranging the second transistor is a rectangular region with a ratio of its short side and long side being 1 to N, where N is a positive value.

14. The semiconductor device according to claim 12, wherein the first and second transistors each have a channel, with the semiconductor device being manufactured using a silicon wafer including a crystal axis defining a channel direction for each of the first and second transistors and a crystal plane defining a channel formation plane for each of the first and second transistors, with the first and second transistors having different channel directions or different channel formation planes that are based on mobility of a carrier dependent on the conductivity type.

15. The semiconductor device according to claim 14, wherein the silicon wafer has a (100) plane main surface, on which the first and second transistors are both formed, and a (110) plane orientation flat.

* * * * *